United States Patent
Raley (10) Patent No.: US 10,867,854 B2
(45) Date of Patent: Dec. 15, 2020

(54) DOUBLE PLUG METHOD FOR TONE INVERSION PATTERNING

(71) Applicant: Tokyo Electron Limited, Tokyo (JP)

(72) Inventor: Angelique Raley, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/242,569

(22) Filed: Jan. 8, 2019

(65) Prior Publication Data

US 2020/0219767 A1 Jul. 9, 2020

(51) Int. Cl.
*H01L 21/28* (2006.01)
*H01L 21/768* (2006.01)
*H01L 21/3213* (2006.01)
*H01L 21/02* (2006.01)

(52) U.S. Cl.
CPC .... *H01L 21/76897* (2013.01); *H01L 21/0228* (2013.01); *H01L 21/02282* (2013.01); *H01L 21/32133* (2013.01)

(58) Field of Classification Search
CPC .................................................. H01L 21/28123
See application file for complete search history.

(56) References Cited

U.S. PATENT DOCUMENTS

| | | | |
|---|---|---|---|
| 2011/0281427 A1* | 11/2011 | Choi | H01L 21/28052 438/587 |
| 2017/0148637 A1* | 5/2017 | deVilliers | H01L 21/0337 |
| 2018/0138051 A1 | 5/2018 | deVilliers et al. | |
| 2019/0096666 A1* | 3/2019 | Zhou | H01L 21/823431 |

* cited by examiner

*Primary Examiner* — Peniel M Gumedzoe
*Assistant Examiner* — Christopher A Johnson
(74) *Attorney, Agent, or Firm* — Oblon, McClelland, Maier & Neustadt, L.L.P.

(57) ABSTRACT

Double plug methods for tone inversion patterning are described. In an embodiment, a method may include receiving the substrate having a multi-line layer formed thereon. Such a method may also include forming a patterned recess in the multi-line layer, the recess defining an inversion pattern on the substrate. The methods may also include depositing a first plug layer in the patterned recess using a first deposition process. Additionally, the methods may include depositing a second plug layer in the patterned recess using a second deposition process, the second deposition process being different from the first deposition process.

18 Claims, 8 Drawing Sheets

SOG Plug Only

Post SOG/ALD etch back + Ash

FIG. 7A

Post SiN Pull

FIG. 7B

Post TiN Open + Dielectric RIE

FIG. 7C

ALD + SOG

DOUBLE PLUG METHOD FOR TONE INVERSION PATTERNING

BACKGROUND OF THE INVENTION

Field of Invention

The present invention relates to a system and method for substrate processing, and more particularly to double plug methods for tone inversion patterning and systems for producing the same.

Description of Related Art

Tone inversion is one promising patterning techniques for patterning at advanced node due to pillar flop over concerns. Materials used to tone invert such as spin on materials may not have etch resistance needed to keep local CD and blocks in place. However, these spin on materials are indispensable to planarize wider features.

SUMMARY OF THE INVENTION

Double plug methods for tone inversion patterning are described. In an embodiment, a method may include receiving the substrate having a multi-line layer formed thereon, the multi-line layer including a region having a pattern of alternating lines of a plurality of materials, wherein each line has a horizontal thickness, a vertical height, and extends horizontally across an underlying layer, wherein each line of the pattern of alternating lines extends vertically from a top surface of the multi-line layer to a bottom surface of the multi-line layer. Such a method may also include forming a patterned recess in the multi-line layer, the recess defining an inversion pattern on the substrate. The methods may also include depositing a first plug layer in the patterned recess using a first deposition process. Additionally, the methods may include depositing a second plug layer in the patterned recess using a second deposition process, the second deposition process being different from the first deposition process.

Embodiments of systems for processing a substrate are also presented. In an embodiment, a system may include a processing chamber configured to receive the substrate having a multi-line layer formed thereon, the multi-line layer including a region having a pattern of alternating lines of a plurality of materials, wherein each line has a horizontal thickness, a vertical height, and extends horizontally across an underlying layer, wherein each line of the pattern of alternating lines extends vertically from a top surface of the multi-line layer to a bottom surface of the multi-line layer. The system may also include a photolithography component configured to form a patterned recess in the multi-line layer, the recess defining an inversion pattern on the substrate. Additionally, the system may include an atomic layer deposition (ALD) component configured to deposit a first plug layer in the patterned recess using an ALD process. Also, such a system may include a spin-on deposition component configured to deposit a second plug layer in the patterned recess using a spin-on deposition process.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Double plug methods for tone inversion patterning are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, where like reference numerals designate identical or corresponding parts throughout the several views.

Figure 1:
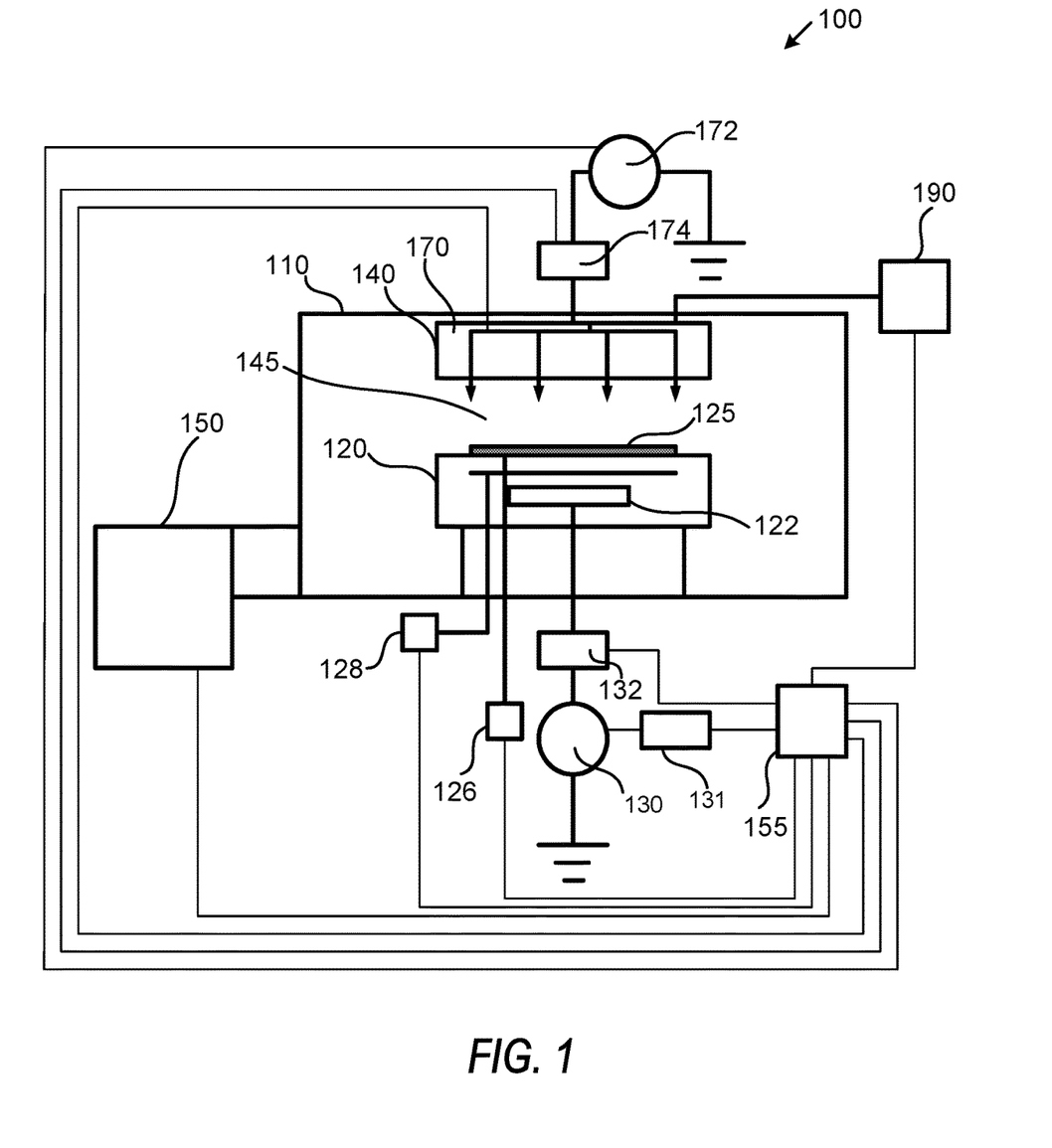
FIG. 1 illustrates one embodiment of a reactive ion etch (RIE) tool for semiconductor processing.

FIG. 1 is an embodiment of a system 100 for plasma processing of double plug methods for tone inversion pattering. In a further embodiment, the system 100 may be configured to perform aspects of the double plug method for tone inversion patterning as described in the embodiments of FIGS. 3-6E. An etch and plasma-assisted deposition system 100 configured to perform the above identified process conditions is depicted in FIG. 1 comprising a processing chamber 110, substrate holder 120, upon which a wafer 125 to be processed is affixed, and vacuum pumping system 150. The wafer 125 can be a semiconductor substrate, a wafer, a flat panel display, or a liquid crystal display. Processing chamber 110 can be configured to facilitate etching the processing region 145 in the vicinity of a surface of the wafer 125. An ionizable gas or mixture of process gases is introduced via a gas distribution system 140. For a given flow of process gas, the process pressure is adjusted using the vacuum pumping system 150.

The wafer 125 can be affixed to the substrate holder 120 via a clamping system (not shown), such as a mechanical clamping system or an electrical clamping system (e.g., an electrostatic clamping system). Furthermore, substrate holder 120 can include a heating system (not shown) or a cooling system (not shown) that is configured to adjust and/or control the temperature of substrate holder 120 and the wafer 125. The heating system or cooling system may comprise a re-circulating flow of heat transfer fluid that receives heat from substrate holder 120 and transfers heat to a heat exchanger system (not shown) when cooling, or transfers heat from the heat exchanger system to substrate holder 120 when heating. In other embodiments, heating/cooling elements, such as resistive heating elements, or thermo-electric heaters/coolers can be included in the substrate holder 120, as well as the chamber wall of the processing chamber 110 and any other component within the processing system 100.

Additionally, a heat transfer gas can be delivered to the backside of wafer 125 via a backside gas supply system 126 in order to improve the gas-gap thermal conductance between wafer 125 and substrate holder 120. Such a system can be utilized when temperature control of the wafer 125 is required at elevated or reduced temperatures. For example, the backside gas supply system can comprise a two-zone gas distribution system, wherein the helium gas-gap pressure can be independently varied between the center and the edge of wafer 125.

In the embodiment shown in FIG. 1, substrate holder 120 can comprise an electrode 122 through which RF power is coupled to the processing region 145. For example, substrate holder 120 can be electrically biased at a RF voltage via the transmission of RF power from a RF generator 130 through an optional impedance match network 132 to substrate holder 120. The RF electrical bias can serve to heat electrons to form and maintain plasma. In this configuration, the system 100 can operate as an RIE reactor, wherein the chamber and an upper gas injection electrode serve as ground surfaces.

Furthermore, the electrical bias of electrode 122 at a RF voltage may be pulsed using pulsed bias signal controller 131. The RF power output from the RF generator 130 may be pulsed between an off-state and an on-state, for example. Alternately, RF power is applied to the substrate holder electrode at multiple frequencies. Furthermore, impedance match network 132 can improve the transfer of RF power to plasma in plasma processing chamber 110 by reducing the reflected power. Match network topologies (e.g. L-type, π-type, T-type, etc.) and automatic control methods are well known to those skilled in the art.

Gas distribution system 140 may comprise a showerhead design for introducing a mixture of process gases. Alternatively, gas distribution system 140 may comprise a multi-zone showerhead design for introducing a mixture of process gases, and adjusting the distribution of the mixture of process gases above wafer 125. For example, the multi-zone showerhead design may be configured to adjust the process gas flow or composition to a substantially peripheral region above wafer 125 relative to the amount of process gas flow or composition to a substantially central region above wafer 125. In such an embodiment, gases may be dispensed in a suitable combination to form a highly uniform plasma within the chamber 110.

Vacuum pumping system 150 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 110.

In an embodiment, the source controller 155 can comprise a microprocessor, memory, and a digital I/O port capable of generating control voltages sufficient to communicate and activate inputs to processing system 100 as well as monitor outputs from plasma processing system 100. Moreover, source controller 155 can be coupled to and can exchange information with RF generator 130, pulsed bias signal controller 131, impedance match network 132, the gas distribution system 140, the gas supply 190, vacuum pumping system 150, as well as the substrate heating/cooling system (not shown), the backside gas supply system 126, and/or the electrostatic clamping system 128. For example, a program stored in the memory can be utilized to activate the inputs to the aforementioned components of processing system 100 according to a process recipe in order to perform a plasma assisted process, such as a plasma etch process or a post heating treatment process, on wafer 125.

In addition, the processing system 100 can further comprise an upper electrode 170 to which RF power can be coupled from RF generator 172 through optional impedance match network 174. A frequency for the application of RF power to the upper electrode can range from about 0.1 MHz to about 200 MHz, in one embodiment. Alternatively, the present embodiments may be used in connection with Inductively Coupled Plasma (ICP) sources, Capacitive Coupled Plasma (CCP) sources, Radial Line Slot Antenna (RLSA) sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 80 MHz. Moreover, source controller 155 is coupled to RF generator 172 and impedance match network 174 in order to control the application of RF power to upper electrode 170. The design and implementation of an upper electrode is well known to those skilled in the art. The upper electrode 170 and the gas distribution system 140 can be designed within the same chamber assembly, as shown. Alternatively, upper electrode 170 may comprise a multi-zone electrode design for adjusting the RF power distribution coupled to plasma above wafer 125. For example, the upper electrode 170 may be segmented into a center electrode and an edge electrode.

Depending on the applications, additional devices such as sensors or metrology devices can be coupled to the processing chamber 110 and to the source controller 155 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pull-down of structures (pulldown), slimming of structures (slimming), aspect ratio of structures (aspect ratio), line width roughness, substrate throughput, cost of ownership, and the like are achieved.

By modulating the applied power, typically through variation of the pulse frequency and duty ratio, it is possible to obtain markedly different plasma properties from those produced in continuous wave (CW). Consequently, RF power modulation of the electrodes can provide control over time-averaged ion flux and the ion energy.

Figure 2:
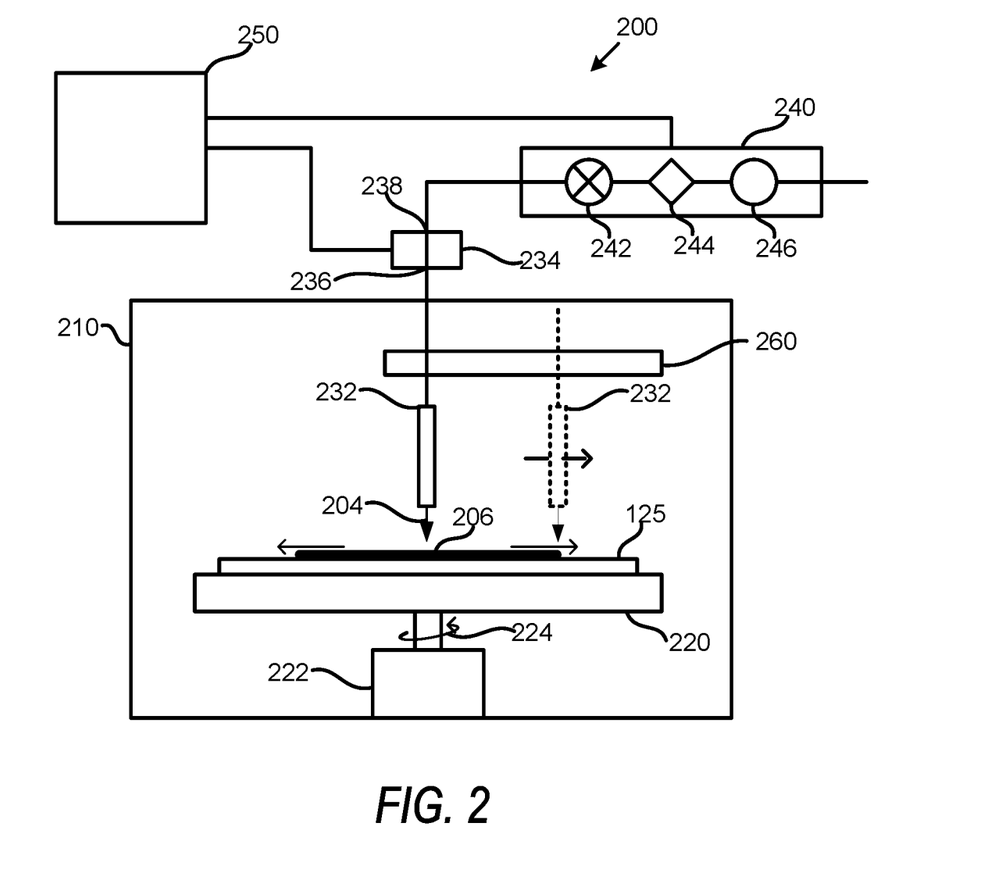
FIG. 2 illustrates an embodiment of a spin-on coating system semiconductor processing.

FIG. 2 illustrates a coating system 200 including a coating chamber 210, a substrate holder 220 coupled to the coating chamber 210 and configured to support wafer 125, and a solution nozzle assembly 232 configured to dispense a solution, such as a spinnable silicon oxide material, a spinnable silicon nitride material, a spin-on-carbon material, a spin-on-glass material, or the like. Additionally, the coating system 200 includes a controller 250 coupled to the substrate holder 220 and the solution nozzle assembly 232, and configured to exchange data, information, and control signals with the substrate holder 220 and the solution nozzle assembly 230.

The substrate holder 220 is configured to rotate (or spin) wafer 125 during dispensing of solution on the upper surface of wafer 125 from the solution nozzle assembly 230. A drive unit 222 coupled to the substrate holder 220 is configured to rotate the substrate holder 220. The drive unit 222 can, for example, permit setting the rotation rate, and the rate of acceleration of the substrate holder rotation 224.

The solution nozzle assembly 230 includes a single nozzle 232 positioned substantially near the center of wafer 125, and above an upper surface thereof. The nozzle 232 is configured to dispense a solution, such as a spinnable silicon oxide material, a spinnable silicon nitride material, a photosensitive patternable photoresist layer, a spin-on-carbon material, a spin-on-glass material, or the like, on an upper surface of wafer 125 in a direction substantially perpendicular to the upper surface of wafer 125. The nozzle 232 is coupled to an outlet end 236 of a control valve 234. An inlet end 238 of control valve 234 is coupled to a solution supply system 240. The control valve 234 can be configured to regulate dispensing the solution on wafer 125. When open, the solution is dispensed upon the wafer 125. When closed, the solution is not dispensed upon the wafer 125. The solution supply system 240 can include at least one of a fluid supply valve 242, a filter 244, and a flow measurement/control device 246. Additionally, nozzle 232 is configured to translate in a radial direction from the center of wafer 125 to the peripheral edge of wafer 125 using translation drive assembly 260, while dispensing solution as shown by the ghost image of nozzle 232.

Additionally, controller 250 includes a microprocessor, memory, and a digital I/O port (potentially including D/A and/or A/D converters) capable of generating control voltages sufficient to communicate and activate inputs to the drive unit 222 of substrate holder 220, the solution nozzle assembly 230 (e.g., first control valve 234), solution supply system 240, and translation drive system 260 as well as monitor outputs from these systems. A program stored in the memory is utilized to interact with these systems according to a stored process recipe.

Controller 250 may be locally located relative to coating system 200, or it may be remotely located relative to the coating system 200 via an internet or intranet. Thus, controller 250 can exchange data with coating system 200 using at least one of a direct connection, an intranet, and the internet. Controller 250 may be coupled to an intranet at a customer site (i.e., a device maker, etc.), or coupled to an intranet at a vendor site (i.e., an equipment manufacturer). Furthermore, another computer (i.e., controller, server, etc.) can access controller 250 to exchange data via at least one of a direct connection, an intranet, and the internet.

In some embodiments, the wafer 125 may be passed between the system 100 of FIG. 1 and the system 200 of FIG. 2 for performance of certain aspects of the methods described below. In other embodiments, both systems 100 and 200 may be integrated into a single unit, or a single unit having multiple processing chambers 110, 210, etc.

Figure 3:
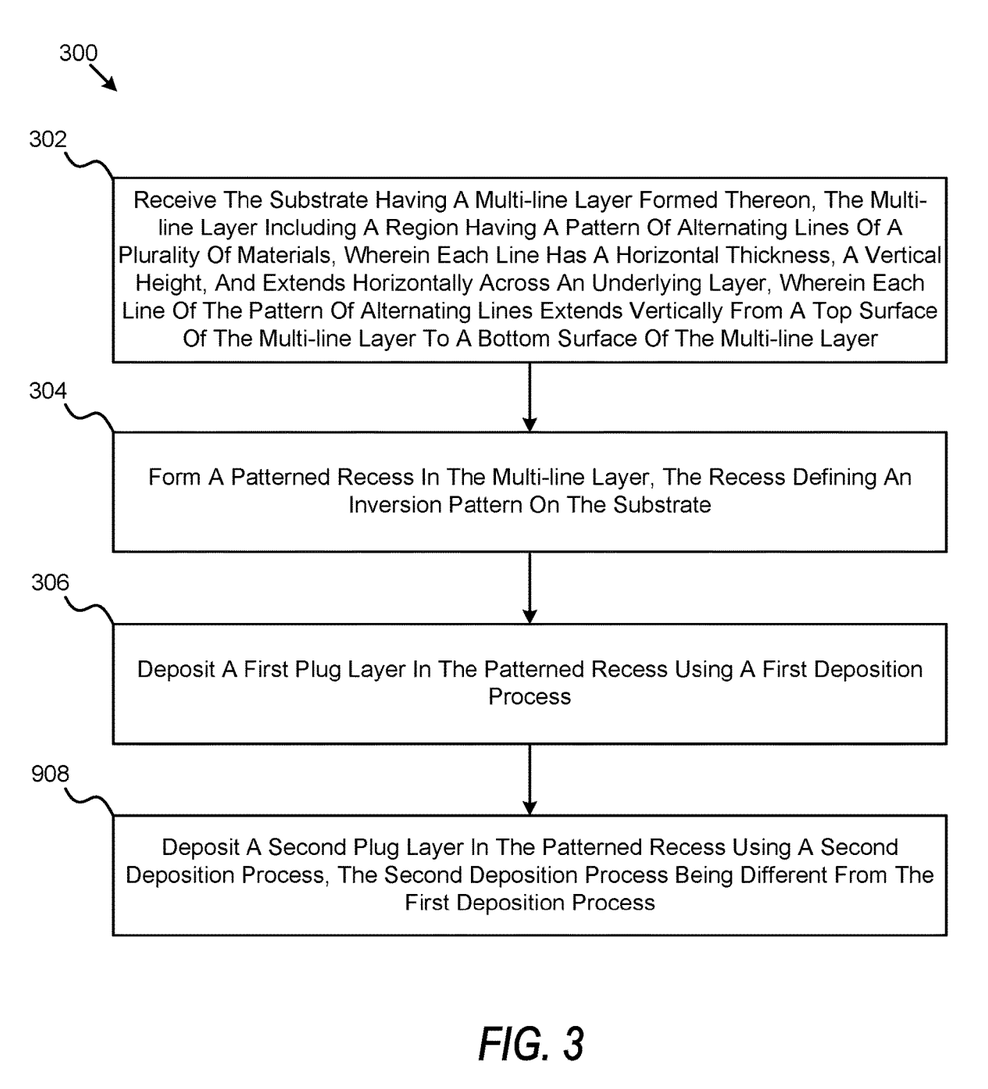
FIG. 3 illustrates one embodiment of a double plug method for tone inversion patterning.

FIG. 3 illustrates an embodiment of a double plug method 300 for tone inversion patterning. In an embodiment, the method 300 includes receiving a substrate having a multi-line layer formed thereon as shown in block 302, the multi-line layer including a region having a pattern of alternating lines of a plurality of materials, wherein each line has a horizontal thickness, a vertical height, and extends horizontally across an underlying layer, wherein each line of the pattern of alternating lines extends vertically from a top surface of the multi-line layer to a bottom surface of the multi-line layer. As shown in block 304, such a method 300 may also include forming a patterned recess in the multi-line layer, the recess defining an inversion pattern on the substrate. In an embodiment, the method 300 may also include depositing a first plug layer in the patterned recess using a first deposition process as shown at block 306. At block 308, the method 300 may include depositing a second plug layer in the patterned recess using a second deposition process, the second deposition process being different from the first deposition process.

Figure 4A:
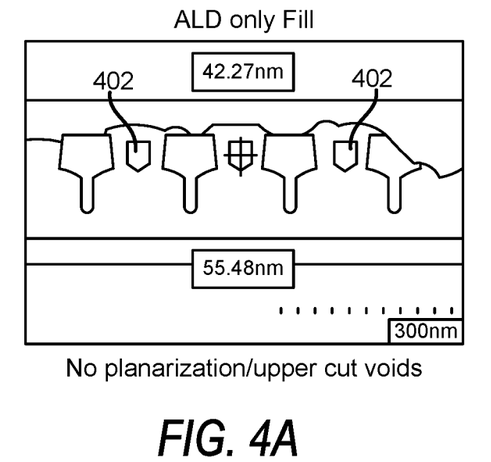
FIG. 4A illustrates a cross-section diagram of a workpiece result of a process for semiconductor processing.

The embodiment of systems and methods described above my produce a wafer 125 having a structure formed thereon as illustrated in FIG. 4A. The embodiment illustrated in FIG. 4A illustrates possible defects 402 that may arise in tone inversion processes that use ALD processes alone or, alternatively, spin-on processes alone. For example, a defect 402 may be a gap or void formed as indicated in FIG. 4A. In one embodiment, the defect 402 may be formed in a plug formed for the tone inversion process. The defect 402 may be formed in a layer above the multi-line layer in some embodiments. In other embodiments, defects 402 may be formed in the multi-line layer. Other defects may include incompletely filled recesses in the multi-line layer, etc.

Figure 4B:
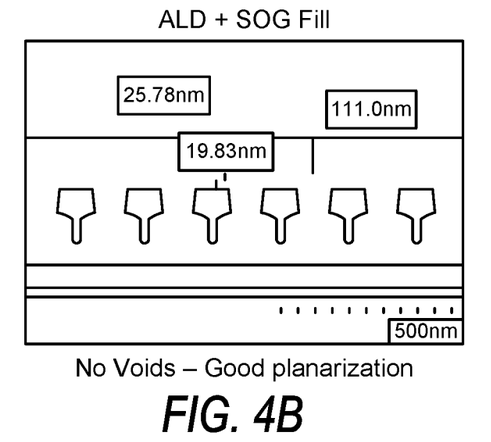
FIG. 4B illustrates a cross-section diagram of a workpiece result of a process for semiconductor processing.

As illustrated in FIG. 4B, the defects 402 may be avoided in an embodiment of the method 300 as described in FIG. 3, where a first plug layer is formed using, for example, an ALD process and then a second plug layer is formed using, for example, a spin-on process. As shown in FIG. 4B, such embodiments yield more consistent plug formations than those yielded by processes that include formation of only a single plug layer using either an ALD process or a spin-on process alone.

FIGS. 5A-5L illustrate embodiments of a processing flow for processing a substrate according to a tone inversion process. At 5A, the process includes receiving a substrate having a plurality of layers formed therein. In an embodiment, such a substrate may include a low K layer 502, a tetraethoxysilane (TEOS) layer 504, a metal hardmask (MHM) layer 506, a core dielectric layer 508, a planarization layer 510, and an anti-reflective coating (ARC) layer 512. In one embodiment a planarization layer 510 may include a spin-on material, such as spin-on-carbon (SOC) or spin-on-glass (SOG). In an embodiment a patterned layer 514 may be formed on the ARC layer 512. In one embodiment, the patterned layer 514 may be a polymer photoresist layer.

Figure 5A:
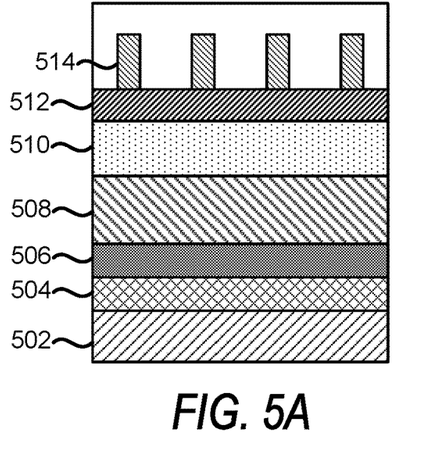
FIG. 5A illustrates a cross-section diagram of one embodiment of a workpiece at a step of a semiconductor fabrication process for tone inversion patterning.
Figure 5B:
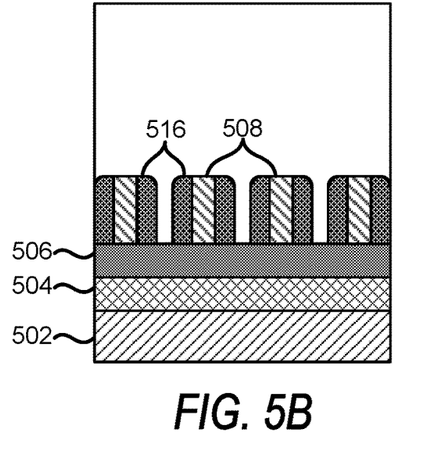
FIG. 5B illustrates a cross-section diagram of one embodiment of a workpiece at a step of a semiconductor fabrication process for tone inversion patterning.

FIG. 5B illustrates etching the stack illustrated in FIG. 5A to remove portions of the core dielectric layer 508 according to the pattern defined by the patterned layer 514. In an embodiment, the portions of the core dielectric layer 508 left remaining define cores for features to be formed on the substrate. Also at FIG. 5B, spacers 516 may be formed adjacent the cores using a combination of deposition and reactive ion etch methods. One of ordinary skill will recognize a variety of methods for forming the cores of core dielectric layer 508 and spacers 516.

Figure 5C:
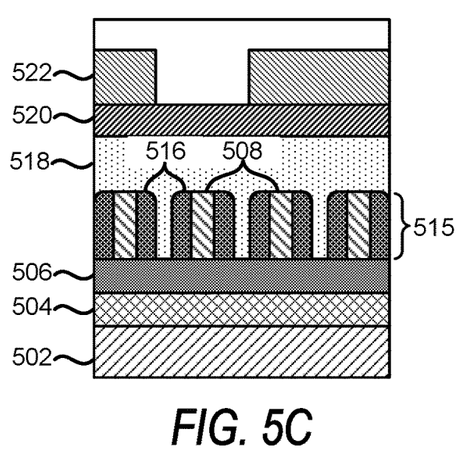
FIG. 5C illustrates a cross-section diagram of one embodiment of a workpiece at a step of a semiconductor fabrication process for tone inversion patterning.

FIG. 5C illustrates a cross-section of an embodiment of a substrate after a second planarization layer 518 is deposited over the features in the core dielectric layer 508 and the spacers 516 are formed. In such an embodiment, gaps between the spacers 516 may be filled with material from the second planarization layer 518. As used herein, the term "multi-line layer" refers to the horizontal arrangement of vertical lines of disperse materials, including for example, the combination of spacers 516, features in the core dielectric layer 508, and portions of the second planarization layer 518 as illustrated in the multi-line layer 515 of FIG. 5C. In addition, a second ARC layer 520 may be formed on the second planarization layer 518, and a second patterned layer 522 may be formed on the second ARC layer 520.

Figure 5D:
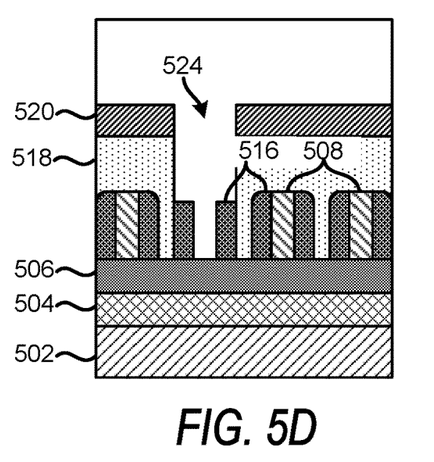
FIG. 5D illustrates a cross-section diagram of one embodiment of a workpiece at a step of a semiconductor fabrication process for tone inversion patterning.

In an embodiment, as illustrated in FIG. 5O, areas of the second ARC layer 520 and the second planarization layer 518 left exposed by the second patterned layer 522 may be etched away to create a first recess 524. In one such embodiment, the second recess 518 may remove one of the features in the core dielectric layer 508. In an embodiment, first recess 524 may be formed using one or more etch processes, including for example, a reactive ion etch process. Such processes may be performed in the system 100 of FIG. 1.

Figure 5E:
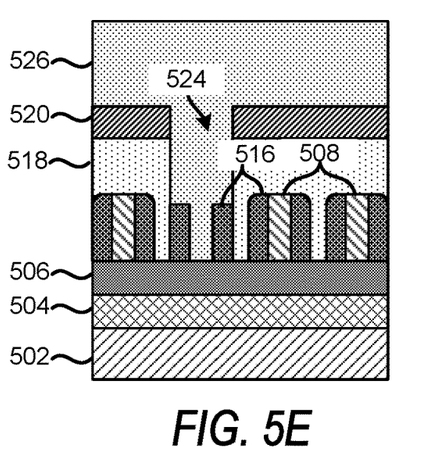
FIG. 5E illustrates a cross-section diagram of one embodiment of a workpiece at a step of a semiconductor fabrication process for tone inversion patterning.

In the embodiment of FIG. 5E, a first plug layer 526 may be formed in the recess 524. In one embodiment, the first plug layer 526 may be formed by depositing a spin-on block coat over the substrate. The spin-on block coat may at least partially fill the portion of the multi-line layer 515 formed between spacers 516. Unfortunately, as discussed with relation to FIG. 4A, the gap may not be completely filled by the plug 526 due to limitations of spin-on technologies and the dimensions of features in the multi-line layer 515.

Figure 5F:
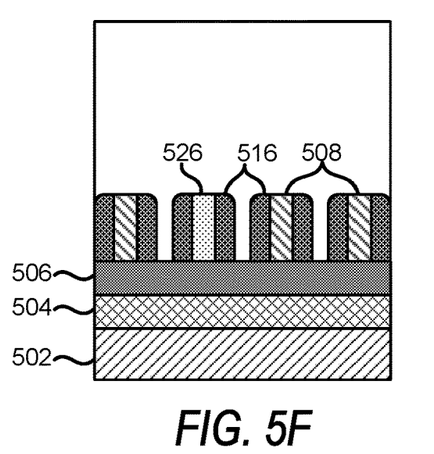
FIG. 5F illustrates a cross-section diagram of one embodiment of a workpiece at a step of a semiconductor fabrication process for tone inversion patterning.

The result of FIG. 5F illustrates the substrate after the removal of the second planarization layer 518 and layers formed thereon. In an embodiment, the second planarization layer 518 may be removed from portions of the multi-line layer 515 as well.

Figure 5G:
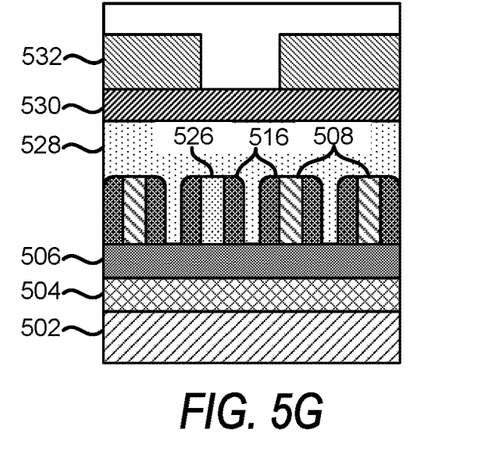
FIG. 5G illustrates a cross-section diagram of one embodiment of a workpiece at a step of a semiconductor fabrication process for tone inversion patterning.
Figure 5H:
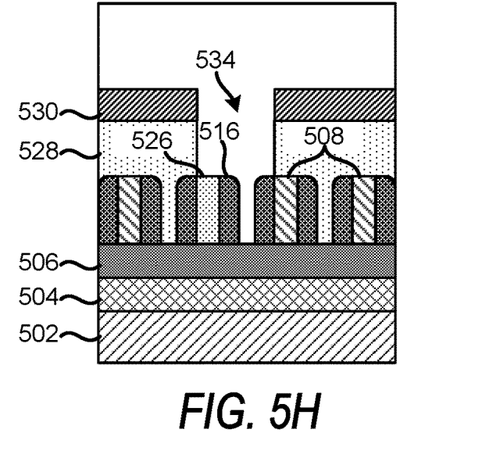
FIG. 5H illustrates a cross-section diagram of one embodiment of a workpiece at a step of a semiconductor fabrication process for tone inversion patterning.
Figure 5I:
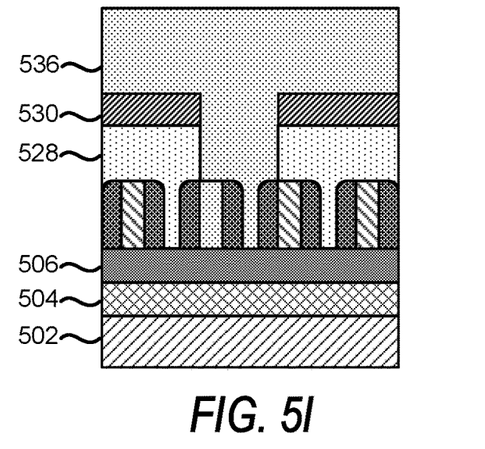
FIG. 5I illustrates a cross-section diagram of one embodiment of a workpiece at a step of a semiconductor fabrication process for tone inversion patterning.

At FIG. 5G, a third planarization layer 528 is deposited on the substrate over the multi-line layer 515. Additionally, a third ARC layer 530 may be deposited over the third planarization layer 528 and a third patterned layer 532 formed thereon, in an embodiment, as illustrated in FIG. 5H, a second recess 534 may be formed through the third ARC layer 530 and the third planarization layer 528 down through a selected portion of the multi-line layer 515 to the MHM layer 506. As illustrated in FIG. 5I, the second recess 534 may be filled with a second plug layer 536.

In the embodiment of FIG. 5I, the second plug layer 536 may be formed in the recess 534. In one embodiment, the first plug layer 536 may be formed by depositing a spin-on block coat over the substrate. The spin-on block coat may at least partially fill the portion of the multi-line layer 515 formed between spacers 516. Unfortunately, as discussed with relation to FIG. 4A, the gap may not be completely filled by the second plug layer 536 due to limitations of spin-on technologies and the dimensions of features in the multi-line layer 515.

Figure 5J:
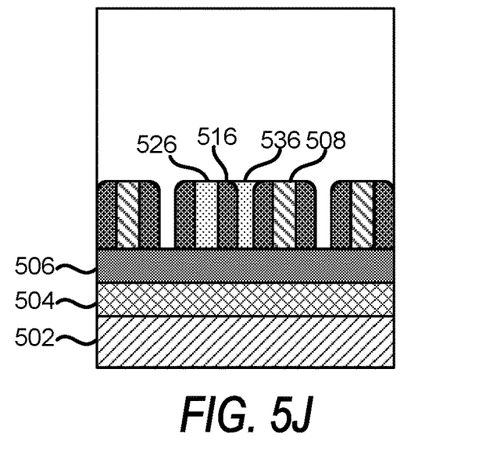
FIG. 5J illustrates a cross-section diagram of one embodiment of a workpiece at a step of a semiconductor fabrication process for tone inversion patterning.
Figure 5K:
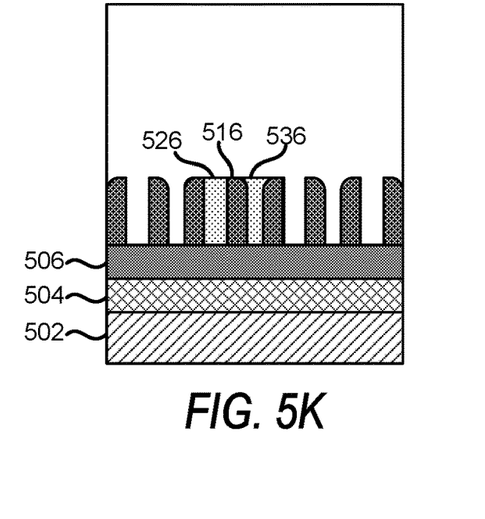
FIG. 5K illustrates a cross-section diagram of one embodiment of a workpiece at a step of a semiconductor fabrication process for tone inversion patterning.

In FIG. 5J, portions of the second plug layer 536 and the third ARC layer 530 are removed above the multi-line layer 515. Additionally, the third planarization layer 528 may be removed, including in portions of the multi-line layer 515 as shown. The resulting multi-line layer 515 may include lines comprising spacers 516, the core dielectric layer 508, the first plug layer 526 and the second plug layer 536. In the embodiment of FIG. 5K, the lines comprising the core dielectric layer 508 may be removed and in FIG. 5L, the MHM layer 506 may be etched in regions exposed by gaps between the spacers and the removed core dielectric layer 508. For example, the MHM layer 508 may be etched using a reactive ion etch, or the like.

Although the embodiments described with relation to FIGS. 5A-5L have been presented in a certain order of operations, or a certain order of arranged or deposited layers, one of ordinary skill will recognize that more, less, or alternative operations and material layers may be used without limitation, and without deviating from the scope of the present embodiments. Indeed, one of ordinary skill will recognize that alternative materials, or alternative physical features may be formed according to the described processes in various embodiments.

As further described above, certain aspects of the process described, particularly in FIGS. 5E and 5I are problematic when the critical dimension of gaps in the multi-line layer 515 are small enough that spin-on coatings cannot fully fill the gap. In an embodiment, the additional steps described in FIGS. 6A-6E may be used to mitigate formation of holes, gaps, or other defects in the first plug layer 526 and/or second plug layer 536.

Figure 6A:
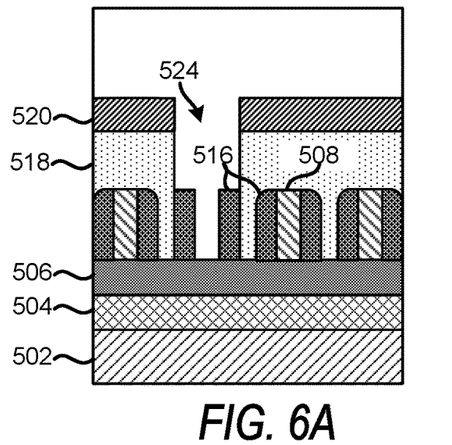
FIG. 6A illustrates a cross-section diagram of one embodiment of a workpiece at a step of a double plug method for tone inversion patterning.

In an embodiment, the process of FIG. 6A starts with receiving the workpiece substantially as described with relation to FIG. 5D, where the recess 524 is formed in the second ARC layer 520 and the second planarization layer 518, including through a portion of the multi-line layer 515 down to the MHM layer 506.

Figure 6B:
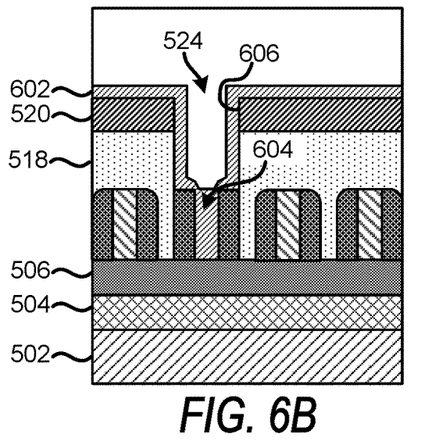
FIG. 6B illustrates a cross-section diagram of one embodiment of a workpiece at a step of a double plug method for tone inversion patterning.

At FIG. 6B, a thin film plug layer 602 may be formed in the recess 524. In an embedment, the thickness of the thin film plug layer 602 may be about half the width of the space between spacers 516 in the region of the multi-line layer 515 removed with the recess 524. In one such embodiment, the thin film plug layer 602 may be deposited using an atomic layer deposition process, or the like, in a further embodiment, the thin film plug layer 602 may also be deposited on vertical surfaces 606 of the recess 524 and horizontal surfaces of the ARC layer 520.

Figure 5L:
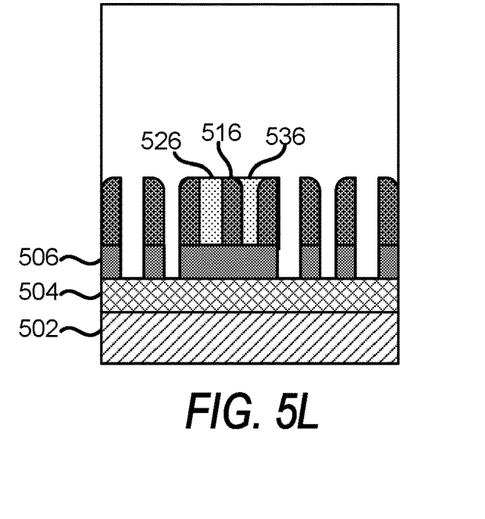
FIG. 5L illustrates a cross-section diagram of one embodiment of a workpiece at a step of a semiconductor fabrication process for tone inversion patterning.
Figure 6C:
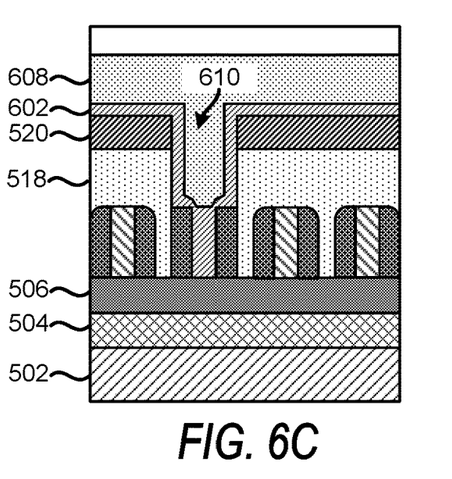
FIG. 6C illustrates a cross-section diagram of one embodiment of a workpiece at a step of a double plug method for tone inversion patterning.

At FIG. 6C, the process may include forming a secondary plug layer 608, including in a gap 610 left by the thin film plug layer 602. In one such embodiment, the secondary plug layer 608 may be formed using a spin-on deposition process. At the step of FIG. 6D, the secondary plug layer 610, thin film plug layer 602, ARC layer 520 and second planarization layer 518 may be removed down to the upper surface of the multi-line layer 515. At step 6E, portions of the second planarization layer 518 in the multi-line layer 515 may be further removed. In such an embodiment, the process may then carry on at FIG. 5G or 5K as described in FIGS. 5A-5L. In embodiments where the process continues at FIG. 5G, steps shown in FIGS. 6B and 6C are used to form third and fourth plug layers that make up the second plug fill shown in FIG. 5I. In such an embodiment, the combination of the thin film plug layer 602 deposited by an ALD process and the secondary plug layer 608 formed by a spin-on deposition process may substantially reduce gaps, holes, and other defects formed in standard plug formation processes. For example, the structure described in FIG. 4A may be a result of a process described in FIGS. 5A-5L, whereas the structure of FIG. 4B may be a result of a process described in FIGS. 6A-6E.

FIGS. 7A-7F illustrate a top view of portions of a workpiece under various stages of processing. In the illustrated embodiments, the process performed on the workpiece is a tone inversion patterning process. Such a process may be particularly useful in self-aligned block patterning, and in particular for self-aligned double patterning (SADP) for devices in the sub-30 nm range of critical dimensions.

Figure 6D:
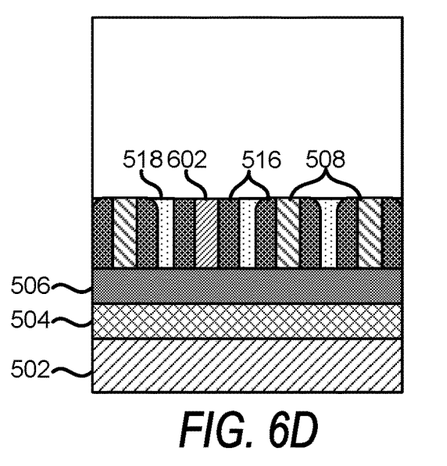
FIG. 6D illustrates a cross-section diagram of one embodiment of a workpiece at a step of a double plug method for tone inversion patterning.
Figure 6E:
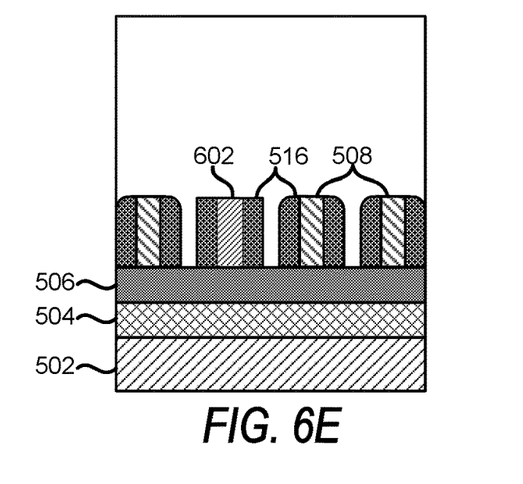
FIG. 6E illustrates a cross-section diagram of one embodiment of a workpiece at a step of a double plug method for tone inversion patterning.
Figure 7A:
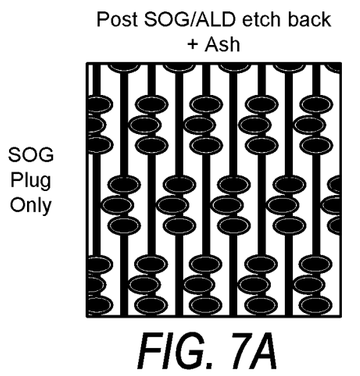
FIG. 7A illustrates a top view diagram of one embodiment of a result of a tone inversion patterning process.
Figure 7B:
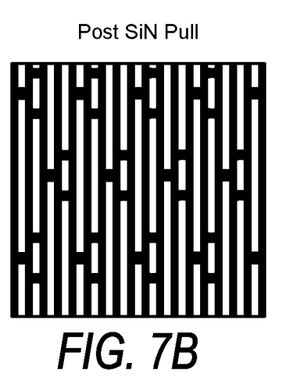
FIG. 7B illustrates a top view diagram of one embodiment of a result of a tone inversion patterning process.
Figure 7C:
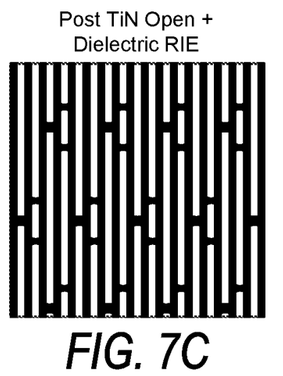
FIG. 7C illustrates a top view diagram of one embodiment of a result of a tone inversion patterning process.
Figure 7D:
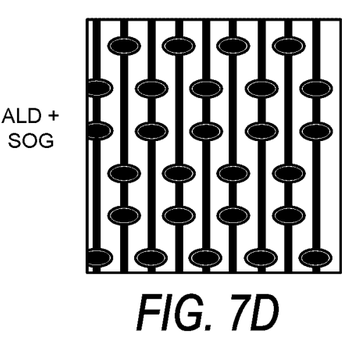
FIG. 7D illustrates a top view diagram of one embodiment of a result of a step of a double plug process for tone inversion patterning.
Figure 7E:
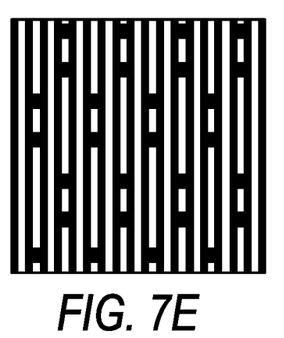
FIG. 7E illustrates a top view diagram of one embodiment of a result of a step of a double plug process for tone inversion patterning.
Figure 7F:
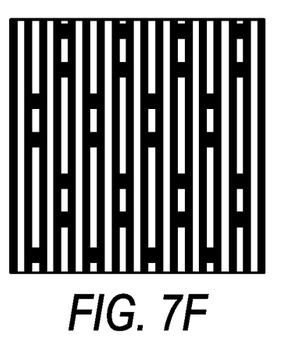
FIG. 7F illustrates a top view diagram of one embodiment of a result of a step of a double plug process for tone inversion patterning.

FIGS. 7A-7C illustrates results of steps of the process described in FIGS. 5A-5I, where only a spin-on plug is formed. FIGS. 7D-7F illustrates results of the double plug process described in FIGS. 6A-6E, where a first ALD plug layer and a second spin-on plug layer are formed.

FIGS. 7A and 7D show a plurality of plugs formed in the workpiece. In the embodiment of FIG. 7A, the plugs may comprise plugs formed from the first plug layer 526 and the second plug layer 536 as illustrated in FIGS. 5F and 5J respectively. The plugs in FIG. 7D may include double plug structures, including plugs formed by the thin film plug layer 602 and the secondary plug layer 608 as illustrated in FIG. 6E. FIGS. 7A and 7D Illustrate the structures after the etchback and ash processes as illustrated in FIG. 6D.

FIGS. 7B and 7E show an embodiment of the workpiece after the planarization layer 518 is removed from the multi-line layer 515. Such a step is shown at FIGS. 5K and 6E respectively. As shown, the result of FIG. 7E shows improved critical dimensions as compared with the result of FIG. 7B.

FIGS. 7C and 7F show an embodiment of the workpiece after etchback of the MHM layer 506 as shown in FIG. 5L. The embodiment of FIG. 7C illustrates the result after a single layer plug is formed as illustrated in FIGS. 5G-5K and the result of FIG. 7F illustrates an embodiment of a result after the augmented process of FIGS. 6A-6E is performed prior to MHM etchback. In the illustrated embodiment, the MHM layer 506 included titanium nitride (TiN).

Comparison of the results of FIGS. 7C and 7F show improved critical dimensions of the plug structures formed by the augmented process of FIGS. 6A-6F and the method illustrated in FIG. 3. One of ordinary skill will recognize various alternative embodiments of methods or applications of such methods that are within the scope of embodiments described or envisioned herein.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

I claim:

1. A method for processing a substrate, the method comprising:
    receiving the substrate having a multi-line layer formed thereon, the multi-line layer including a region having a pattern of alternating lines of a plurality of materials, wherein each line has a horizontal thickness, a vertical height, and extends horizontally across an underlying layer, wherein each line of the pattern of alternating lines extends vertically from a top surface of the multi-line layer to a bottom surface of the multi-line layer;
    forming a patterned recess in the multi-line layer by removing at least one line of the multi-line layer, the recess defining an inversion pattern on the substrate;
    depositing a first plug layer in the patterned recess using a first deposition process;
    depositing a second plug layer in the patterned recess using a second deposition process, the second deposition process being different from the first deposition process; and
    etching the underlying layer using at least the first plug layer as an etch mask.

2. The method of claim 1, wherein the first deposition process comprises an atomic layer deposition (ALD) process.

3. The method of claim 2, wherein first plug layer comprises a material suitable for deposition by the ALD process and is suitable for selective etching with respect to one or more of the plurality of materials comprising the multi-line layer.

4. The method of claim 1, wherein the second deposition process comprises a spin-on process.

5. The method of claim 4, wherein the second plug layer comprises a material suitable for deposition by the spin-on process and is suitable for filling a portion of the patterned recess, the portion of the patterned recess being formed in a coating layer formed over the multi-line layer.

6. The method of claim 1, wherein the multi-line layer further comprises a core dielectric material and spacer material.

7. The method of claim 6, wherein the multi-line layer further comprises a spin-on material.

8. The method of claim 1, wherein forming a patterned recess further comprises:
    forming a patterned layer above the multi-line layer;
    etching one or more layers formed over the multi-line layer in a region exposed by the patterned layer to remove material from the top surface of the multi-line layer; and
    etching a region of the multi-line layer to remove the at least one line of the multi-line layer.

9. The method of claim 1, further comprising removing the second plug layer and adjacent layers to expose the top surface of the multi-line layer.

10. The method of claim 1, further comprising:
    forming a second patterned recess in the multi-line layer, the recess defining an inversion pattern on the substrate;
    depositing a third plug layer in the patterned recess using the first deposition process; and
    depositing a fourth plug layer in the patterned recess using the second deposition process.

11. The method of claim 10, wherein the third plug layer comprises the same material as the first plug layer.

12. The method of claim 10, wherein the fourth plug layer comprises the same material as the second plug layer.

13. The method of claim 1, further comprising performing a tone inversion process on the substrate for removing portions of the multi-line layer proximate to at least one of the first plug layer and the second plug layer.

14. The method of claim 13, wherein removing the second plug comprises performing a chemical mechanical polish (CMP) process.

15. A method for processing a substrate, the method comprising:
    receiving the substrate having a multi-line layer formed thereon, the multi-line layer including a region having a pattern of alternating lines of a plurality of materials, wherein each line has a horizontal thickness, a vertical height, and extends horizontally across an underlying layer, wherein each line of the pattern of alternating lines extends vertically from a top surface of the multi-line layer to a bottom surface of the multi-line layer;
    forming a patterned recess in the multi-line layer, the recess defining an inversion pattern on the substrate;
    depositing a first plug layer in the patterned recess using a first deposition process;
    depositing a second plug layer in the patterned recess using a second deposition process, the second deposition process being different from the first deposition process, wherein the multi-line layer further comprises a core dielectric material, spacer material, and a spin-on material; and
    removing a line in the multi-line layer comprising the spin-on material using an ash process.

16. The method of claim 15, further comprising removing a line in the multi-line layer comprising the core dielectric material.

17. The method of claim 16, further comprising removing a portion of an underlying layer laying under the multi-line layer in a region exposed by removal of the line of core dielectric material.

18. The method of claim 17, further comprising removing a portion of the underlying layer in a region exposed by removal of the line of spin-on material.

* * * * *